United States Patent
Fukuda et al.

(10) Patent No.: US 6,892,452 B2
(45) Date of Patent: May 17, 2005

(54) METHOD OF FORMING A PROJECTION ELECTRODE

(75) Inventors: Yasuo Fukuda, Tokyo (JP); Masakatsu Nagata, Tokyo (JP); Shoji Iwasaki, Kamagaya (JP); Osamu Nakao, Chiba (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 09/842,047

(22) Filed: Apr. 26, 2001

(65) Prior Publication Data

US 2001/0038293 A1 Nov. 8, 2001

(30) Foreign Application Priority Data

Apr. 28, 2000 (JP) ........................................ 2000-130862
Jan. 31, 2001 (JP) ........................................ 2001-024903

(51) Int. Cl.⁷ .............................. H05K 3/02; H05K 3/10
(52) U.S. Cl. .............................. 29/846; 29/829; 29/842; 29/874; 29/884; 438/17; 438/673; 438/701; 438/613; 438/669; 438/745; 438/754; 257/775; 216/11; 205/667
(58) Field of Search ......................... 29/829, 842, 874, 29/884, 846; 438/673, 701, 613, 669, 745, 754, 17; 257/775; 216/11; 205/667

(56) References Cited

U.S. PATENT DOCUMENTS 4,952,272 A * 8/1990 Okino et al. ................... 216/11
5,105,537 A * 4/1992 Datta et al. ................... 205/667
5,686,317 A * 11/1997 Akram et al. ................... 438/17

FOREIGN PATENT DOCUMENTS

JP 5-55306 3/1993 ........... H01L/21/60

OTHER PUBLICATIONS

English language Abstract, JP 5–55306. Mar. 5, 1993.

* cited by examiner

Primary Examiner—Carl J. Arbes
Assistant Examiner—Tim Phan
(74) Attorney, Agent, or Firm—Sughrue Mion, PLLC

(57) ABSTRACT

A Dry-Film resist formed of, for example, a photosensitive film is stacked on the electroconductive material and these portions, other than a projection electrode formation area, formed on a wiring board's electrode serving as a portion of a circuit pattern are masked with a mask. After this, the wiring board is exposed to light and, after the removal of the mask, a development process is performed, thus eliminating the Dry-Film resist on the wiring board at the portion other than the projection electrode formation area. Then the electroconductive material of the wiring board is etched under an etching process to provide a projection electrode having a bump with a pointed tapering end in vertical cross-section. Finally, the wiring board is exposed to a Dry-Film resist elimination solution to remove remaining Dry-Film resist from the projection electrode. And a plating process is performed on the electroconductive material to form a plated layer and hence complete the projection electrode.

15 Claims, 12 Drawing Sheets

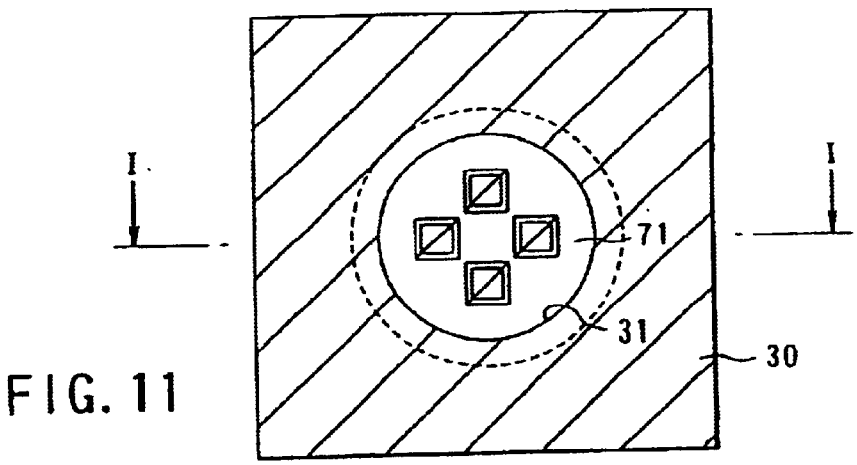
FIG. 11
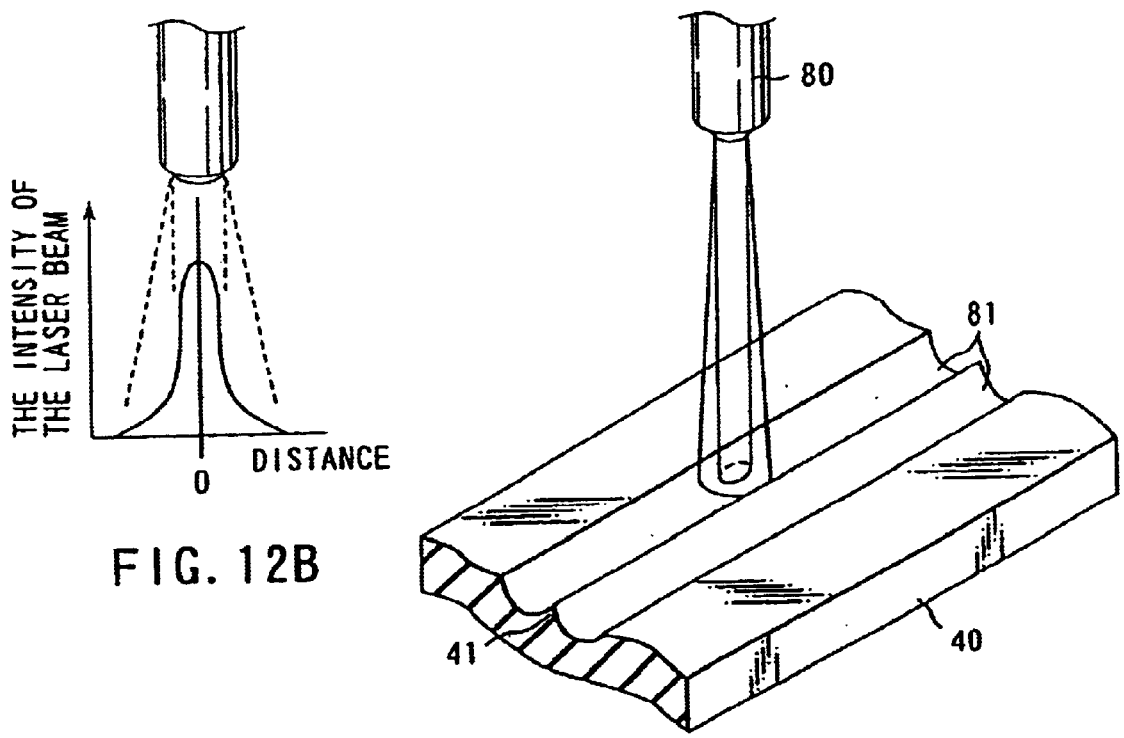
FIG. 12B
FIG. 12A

METHOD OF FORMING A PROJECTION ELECTRODE

CROSS-REFERENCE TO RELATED APPLICATIONS

This application is based upon and claims the benefit of priority from the prior Japanese Patent Applications No. 2000-130862, filed Apr. 28, 2000; and No. 2001-024903, filed Jan. 31, 2001, the entire contents of both of which are incorporated herein by reference.

BACKGROUND OF THE INVENTION

The present invention relates to a projection electrode for use in a semiconductor device, its components, manufacturing apparatus, testing apparatus, and so on and a method for forming the same and apparatus for testing an electronic component.

A projection electrode on a wiring board's electrode used for a semiconductor chip, etc., and a method for forming the same are conventionally known, for example, in Jpn. Pat. Appln. KOKAI No. 5-55306.

This projection electrode 400 is formed as shown in FIG. 15. That is, line-like wirings 200 comprised of a wiring metal material of various kinds of metals such as Au, Ag or Cu or alloys thereof are pattern-formed on an insulating film 100 such as a polyimide resin film. Then, an encapsulating resin 300 having an electrical insulating property, such as a polyester series resin, is coated over the insulating film 100 and the portions of the encapsulating resin 300 situated over the line-like wirings 200 are eliminated by a machine process, a laser beam, etc., to provide line-like wiring exposed portions 700. Finally, a projection electrode 400 is formed by an electroplating method, etc., on the surface of the line-like wiring exposed portions 700 to complete a wiring board 500.

According to this projection electrode and its forming method, it is not necessary to make holes in a base substrate (insulating film 100) and fill an electroconductive substance in the hole. As a result, an added strength can be achieved on the whole wiring board 500 and the thickness, material, etc., of the insulating film 100 can be freely selected in accordance with an intended object. Further, since the projection electrode 400 is formed on the line-like wiring 200, it is easier to recognize the electrode position and circuit pattern configuration, and a semiconductor chip can be easily mounted on the wiring board 500, so that it is possible to achieve an increased production of the semiconductor device.

Also known is a testing apparatus for testing the circuit of a semiconductor device of a bare chip and chip sized package (CSP) by setting the thus formed projection electrode on the corresponding electrode of the testing board comprised of a printed circuit board. According to the testing apparatus for testing this electric component, a socket is used to allow this projection electrode to be connected to the corresponding electrode on the CSP for example and, after the CSP has been mounted on a CSP mount section provided at the socket, the socket is set at a predetermined position on the testing board with the projection electrodes formed thereon to connect the electrode of the CSP to the corresponding projection electrode, and a voltage is applied to the circuit to check the circuit for an operation.

However, the projection electrode 400 formed by the above-mentioned projection electrode method is comprised of a so-called ball bump having a hemispherical surface. In the case where this projection electrode 400 is used on the electric circuit testing board for testing many CSPs in a repeated fashion, a soldering of the electrode material of the CSP electrode is transferred or deposited on its contacting surface of the projection electrode 400 through the repeated contacting of it with the CSP electrode as a contacting object and acts as a resistance and therein arises the problem that, due to the worn state of the projection electrode 400, an electrical connection is noticeably lowered between the testing board-side wiring and the CSP-side circuit wiring. Further, one ball bump-like projection electrode is formed on one basic wiring and, when there occurs, for example, a warp or waviness on the testing board and CSP per se, a non-contacting portion occurs due to a gap between the testing board-side wiring and the CSP electrode, making it impossible to obtain an electric connection therebetween, and hence to perform thorough circuit checking.

BRIEF SUMMARY OF THE INVENTION

It is accordingly one object of the present invention to provide a projection electrode, and a method for forming the same, for securing a positive electrical connection between electrodes of a wiring board and the semiconductor device.

Another object of the present invention is to provide an apparatus for testing an electronic component by adopting, on a testing board, a projection electrode for ensuring a positive electrical connection between the wiring of a testing board and that of a to-be-tested electronic component, over a prolonged period of time.

According to the invention as claimed in claim 1, a projection electrode is provided which comprises an electrode section for making contact with a testing target electrode and one or a plurality of bumps formed on the surface of the electrode section and having a pointed end.

According to the present invention, use is made, as a projection electrode pattern formed on a wiring board, of a projection electrode having one or a plurality of bumps having a pointed tapering end in vertical cross-section, thus involving an advantage of enabling the pointed end of the bump to penetrate a to-be-contacted electrode, thus ensuring a positive electrical connection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a plan view showing the wiring board and a DF having some part removed;

FIGS. 12A and 12B are diagrams explaining a method of forming a mountain-shaped bump on the wiring board;

DETAILED DESCRIPTION OF THE INVENTION

The embodiments of the present invention will be described below with reference to the accompanying drawings.

Figure 1A:
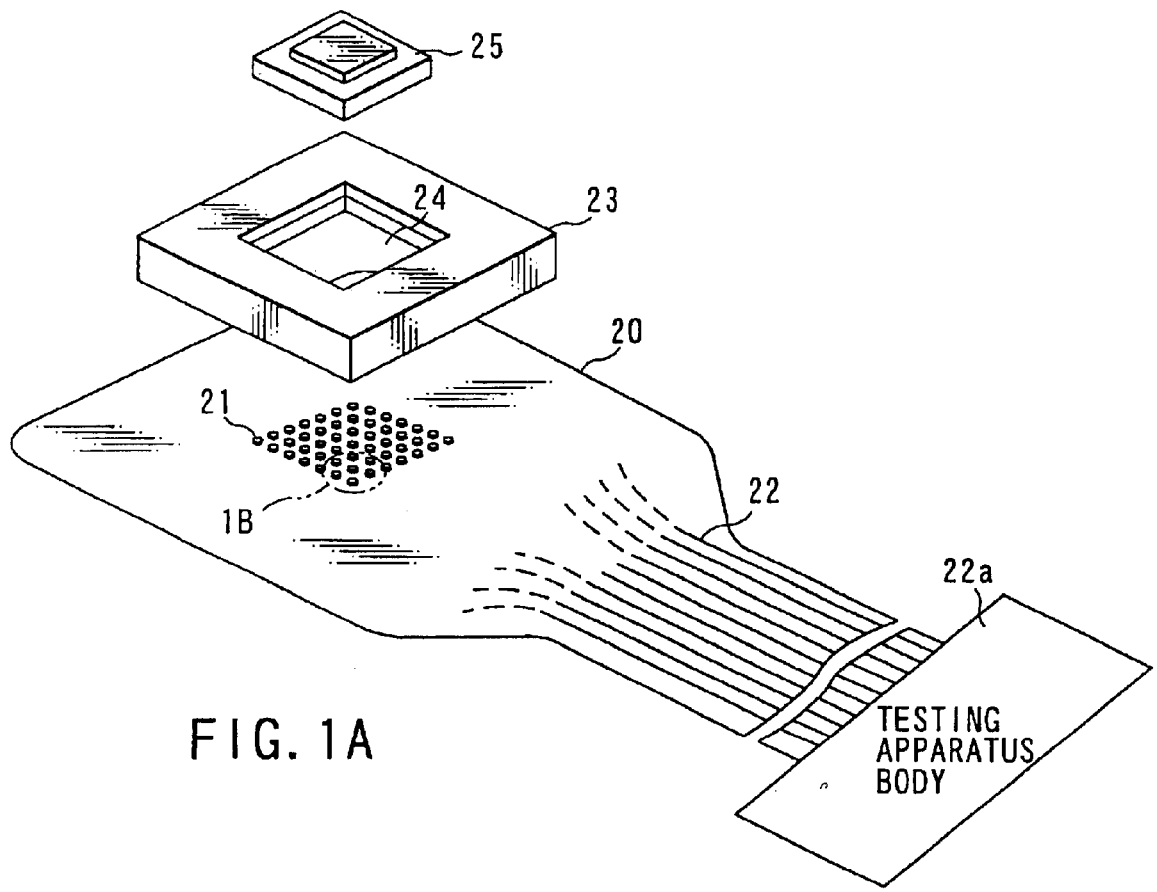
FIG. 1A shows a projection electrode according to a first embodiment of the present invention and a portion of a testing apparatus for testing an electronic component having a testing board with the projection electrode formed thereon.
Figure 1B:
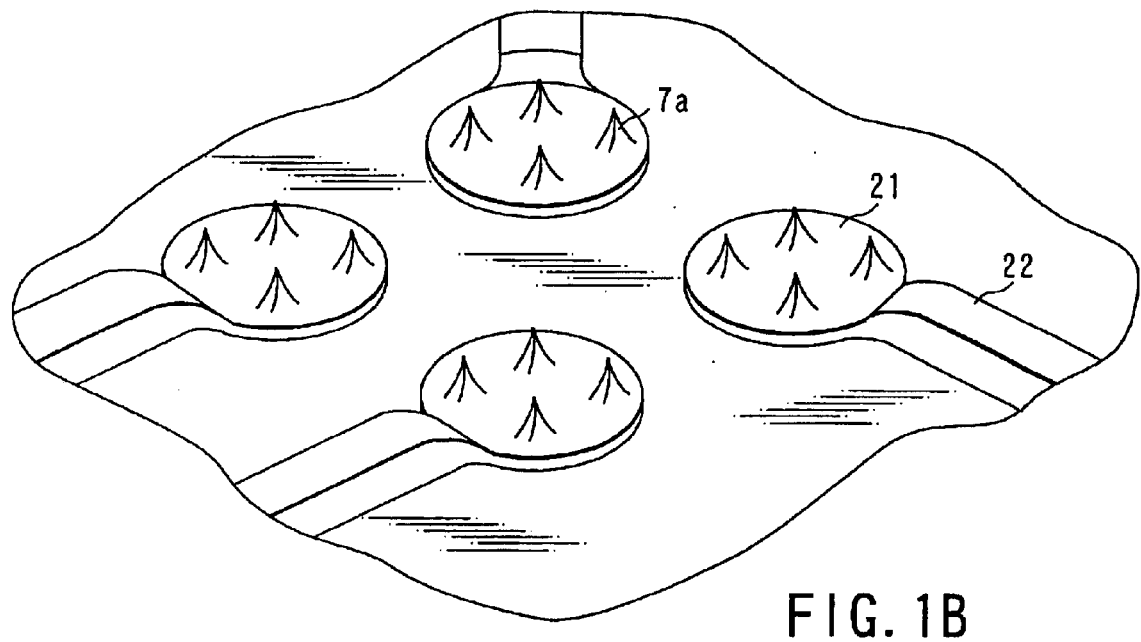
FIG. 1B shows a projection electrode according to a first embodiment of the present invention and a portion of a testing apparatus for testing an electronic component having a testing board with the projection electrode formed thereon.

FIGS. 1A and 1B are views showing projection electrodes according to one embodiment of the present invention, as well as a portion of a testing apparatus for testing an electronic component having a testing board with their projection electrodes formed thereon.

As shown in FIG. 1A, the testing board 20 of the testing apparatus for testing the electronic component serving as an electrode section is comprised of, for example, a flexible printed circuit (FPC) board having a plurality of contacting projection electrodes 21. The contacting projection electrodes 21 are electrically connected through their lead pattern 22 to a testing apparatus body 22a of an electronic circuit. The testing apparatus body reads out outputs, etc., from testing the target component's electrodes in contact with the contacting projection electrodes 21, and tests the electronic component for operational defects. A socket 23 on the testing board 20 includes a chip mount section 24, defining a square opening at its central portion, enabling detachable mounting of, for example, a CSP 25 at the chip mount section 24. In this way, the CSP 25 has its electrode (not shown) side set downwardly at the chip mount section of the socket 23 on the testing board 20 and, as shown in FIG. 1B, a plurality of bumps 7a of the contacting projection electrodes 21 freely set on the testing board 20 are set opposite to, and are directly in contact with, the electrodes of the CSP 25.

Since the bumps 7a of the contacting projection electrode 21 each have a pointed end as shown in FIG. 1B, it follows that, upon contact, the pointed end of the bump is contacted with, or pierces, the corresponding electrode of the CSP 25 to ensure a positive electrical connection between them. In this example, since the contacting electrode 21 has the plurality of bumps 7a, a positive electrical connection can be achieved even in the case where there is some variation among the bumps or there is a warp, etc., in the CSP 25 and in the testing board 20. Further, since the bumps 7a each have a pointed tapering sharp end, even if a large number of CSPs 25 are tested at a testing stage of a manufactured product, the material of the testing object is less liable to be transferred/deposited for example, so that a better electrical connection/physical connection can be maintained.

Figure 2A:
FIGS. 2A to 2G are cross-sectional views showing the process of forming the projection electrode on a wiring board of an electronic component.
Figure 2B:
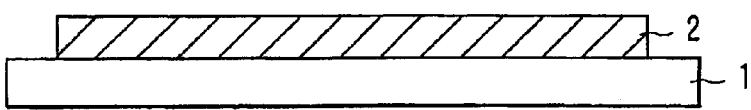
Figure 2C:
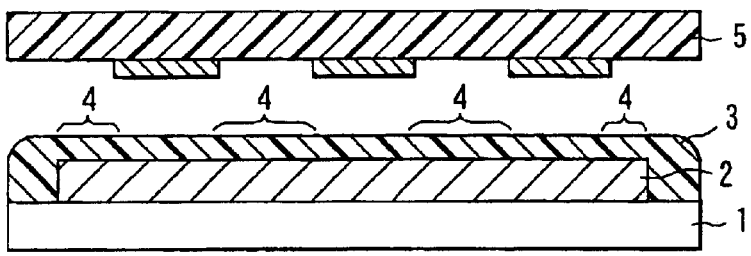
Figure 2D:
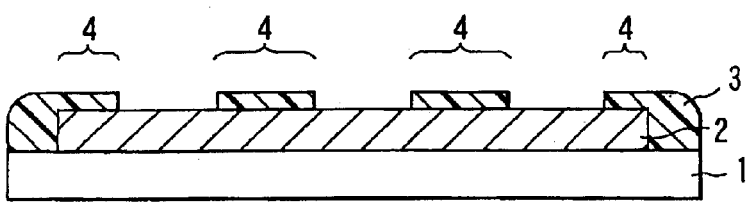
Figure 2E:
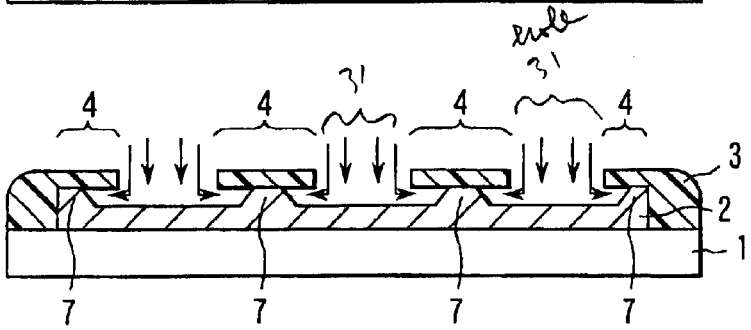
Figure 2F:
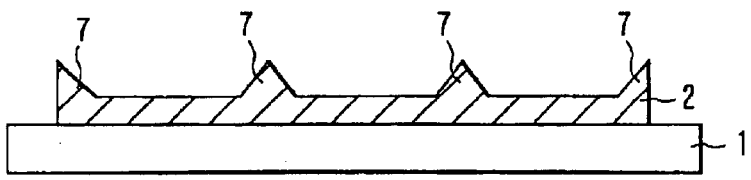
Figure 2G:
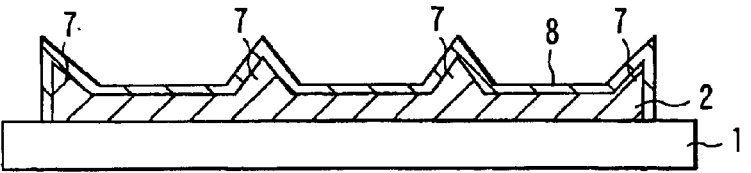
Figure 3:
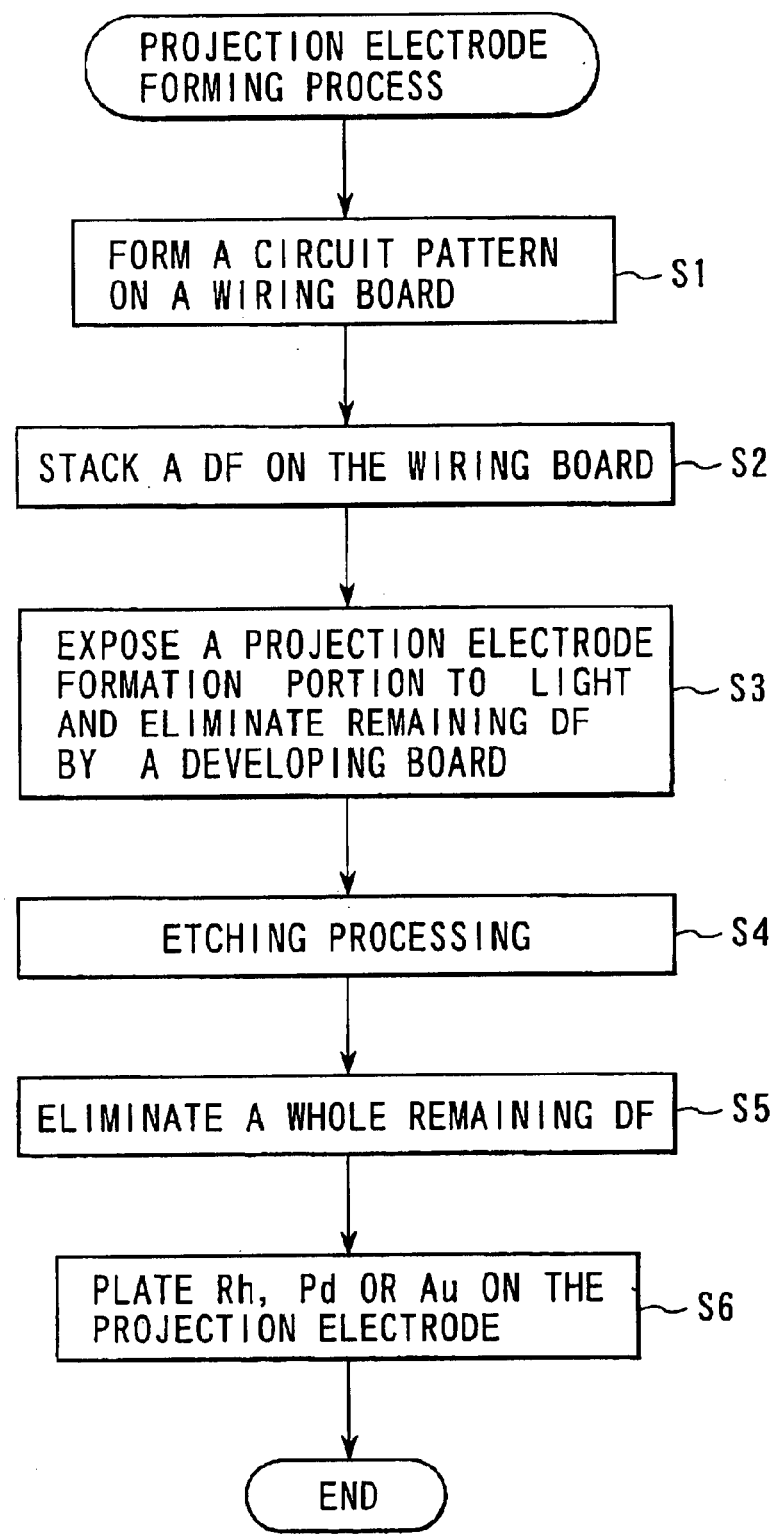
FIG. 3 is a flow chart showing a process for forming the projection electrode.

FIGS. 2A to 2G are cross-sectional views showing the sequential steps of forming such projection electrodes on a wiring board of the electronic component and FIG. 3 is a flow chart showing the steps of forming the projection electrodes.

Figure 4:
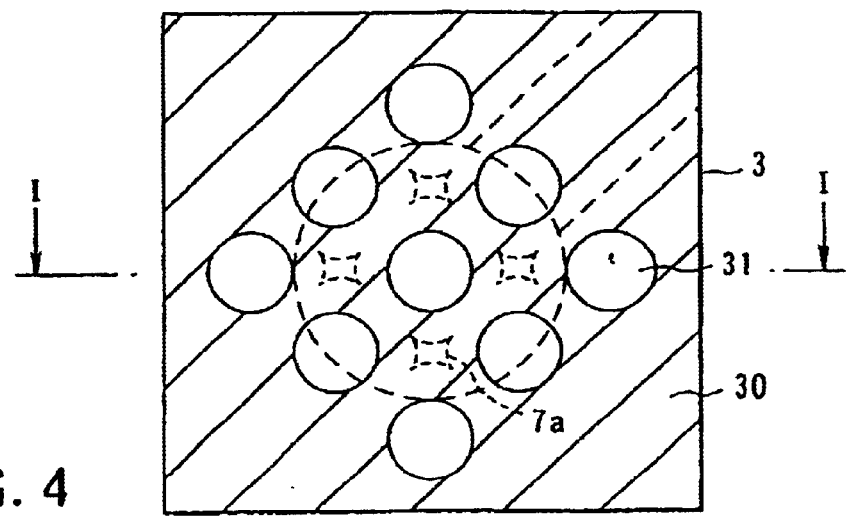
FIG. 4 is a view from above, of a DF and wiring board having a portion eliminated in the process for forming the projection electrode.

As shown in FIG. 2A, a predetermined circuit pattern is formed (S1) by an etching process, etc., on an electroconductive material 2 on a board material such as a copper foil stacking board comprising a printed circuit board 1 of an insulating material and the electroconductive material 2, such as copper, as shown in FIG. 2B. In this case, in place of a copper foil stacking board, a metal such as Zn, Ni, Ag, Pd, Cr, Ti, Be, W, Rh, Ru, etc., or an alloy thereof or an oxide electrode material, such as indium oxide or ruthenium oxide, can be attached, as an electrode material, in the form of a foil, or plated, or formed by a thin film method, such as an evaporation method, on a proper substrate. Then, as shown in FIG. 2C, a dry film resist (hereinafter referred to as a DF) 3 formed of, for example, a photosensitive film, is stacked on the electroconductive material 2 (S2) and those portions other than projection electrode formation areas 4 formed on the wiring board's electrodes, serving as the portions of a circuit pattern, are masked with a mask 5 and exposed to light. After the removal of the mask 5, development is made, thus eliminating the DF 3 (S3) other than the projection electrode formation areas 4 on the wiring board 1 as shown in FIG. 2D. FIG. 4 is a view from above, of a partially eliminated DF 3 and wiring board 1 and, at the step S3, holes 31 are provided where the DF 3 has been eliminated. By doing so, the DF mask portion 30 provides no isolated pattern and the problem involving peeling of the DF mask portion 30 by the etching process can never occur. It is to be noted that FIG. 2E is a cross-sectional view taken along broken line I-I of the wiring board 1 in FIG. 4.

Then, as shown in FIG. 2E, the wiring board 1 is subjected to an isotropic etching process, by which the electroconductive material 2 is gradually etched at those portions other than the projection electrode formation areas 4, to provide projection electrodes 7 having pointed tapering ends in vertical cross-section (S4). If, at this time, under a wet etching process for example, overetching is effected beneath the DF 3 through the utilization of an isotropic corrosion action, it is possible to provide projection electrodes 7 having a sharp-pointed bump end. Finally, the wiring board 1 is exposed to a DF elimination solution of, for example, a halogen-series organic solvent, to remove remaining DF 3 from the projection electrode 7 (S5) as shown in FIG. 2F. A plating process is performed on the etched electroconductive material 2 with the use of rhodium (Rh), palladium (Pd), gold (Au), etc., to provide a plated layer 8 as shown in FIG. 2G, and thus complete the projection electrodes. Although, in the example of this projection electrode forming process, a negative type resist has been explained as the DF 3, even if a light exposure/development process is effected at step S3 with the use of a positive type resist, it is also possible to obtain projection electrodes by an etching process, provided that, in this case, a simple reverse relation is involved between the hole 31 with the DF removed and the DF mask area 30. Further, an added corrosion resistance, etc., can be obtained by performing a plating process on the electroconductive material 2.

Figure 5:
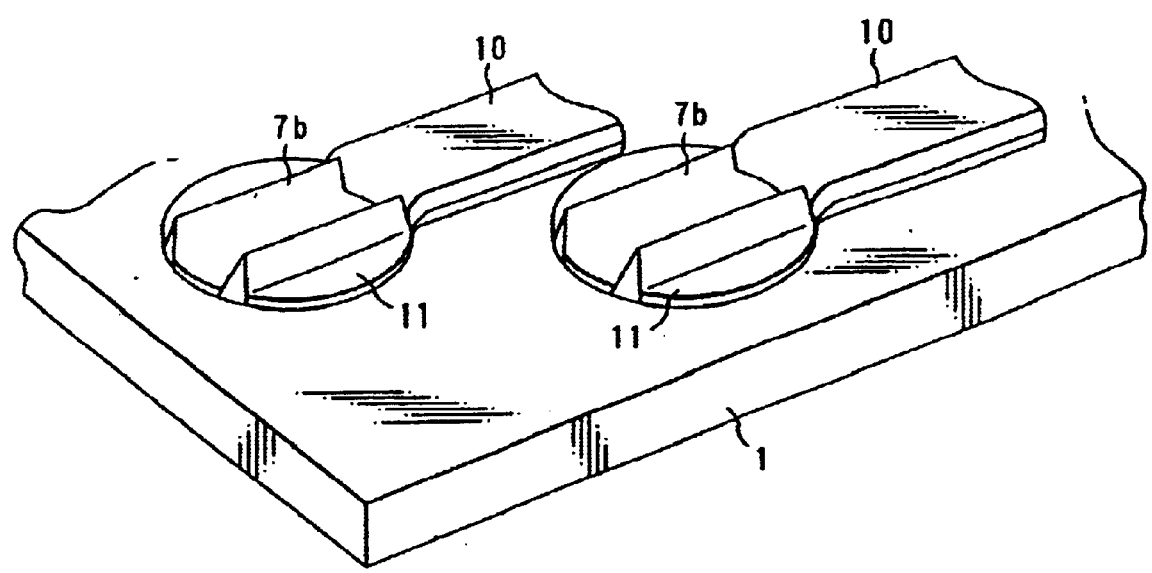
FIG. 5 is a perspective view showing a wiring board with a projection electrode having another bump configuration according to a second embodiment.

FIG. 5 is a perspective view showing a wiring board 1 equipped with projection electrodes 7 having bump configurations, the projection electrode corresponding to a second embodiment of the present invention. The projection electrodes 11 formed on the wiring board 1 with the same process as set out above, are formed in a manner to be connected to a circuit pattern 10 and equipped with ridge bumps 7b having a pointed tapering end in vertical cross-section. In this embodiment, the pointed tapering end is adapted to be linearly connected to an associated electrode and ensures a positive electrical connection to the associated electrode with less connection resistance at the time of connection. It is, therefore, possible to reduce the pressing force of a semiconductor chip with which the chip is mounted. The shape of the projection electrode 11 can be freely determined by changing the process conditions of the thickness and material of the DF 3, composition components of an etching solution or temperature, etc., for example, at the steps S2 to S4. That is, since the direction, etc., in which an electroconductive material 2 is etched with the etching solution can be controlled by changing the process conditions, it is possible to produce the projection electrode 11 having the bump 7a as shown in FIG. 5 and contacting projection electrode 21 having the bump 7a as shown in FIG. 1B to a desired shape and to achieve less variation, etc., in the shape of the projection electrode.

Figure 6:
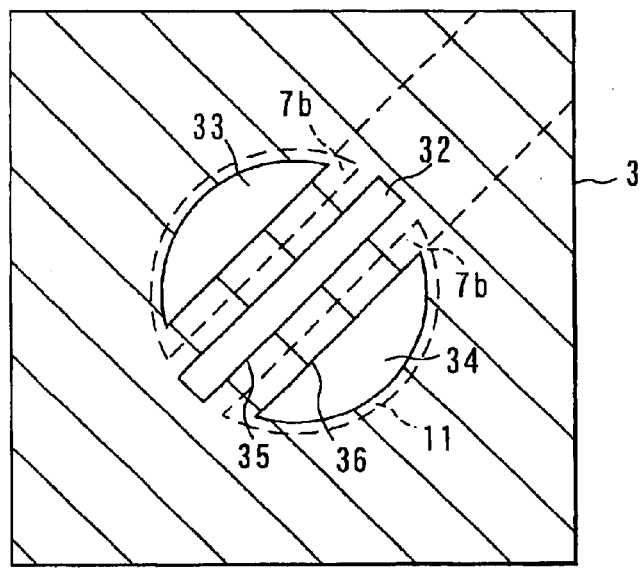
FIG. 6 is a view from above, of a DF according to a second embodiment and wiring board having a portion eliminated in the above process.

In order to form such a bump 7b at the projection electrode 11, it is only necessary to achieve masking with the DF 3 as shown in FIG. 6. The masking by the DF 3 is effected by forming narrower holes 32, 33 and 34 at a middle and both sides on the projection electrode 11 over the DF 3. Bumps 7b of a regular shape, size, etc., can be easily formed beneath the DF mask portions 35, 36 between the holes 32, 33 at one side and between the holes 32 and 34 at the other side, under an isotropic corrosion action of an etching solution from the hole portions 32, 33 and 34. Even in this case, the DF mask portions 35 and 36 stays in a not-isolated pattern. Further, according to the formation method of the projection electrode, the respective bumps are not so formed as to be connected by a plating or bonding, etc., method on to the wiring board's electrode and it is, therefore, possible to enhance the peeling resistance of the bump.

The third embodiment of the present invention will be described, with reference to FIGS. 7 to 14.

Figure 7:
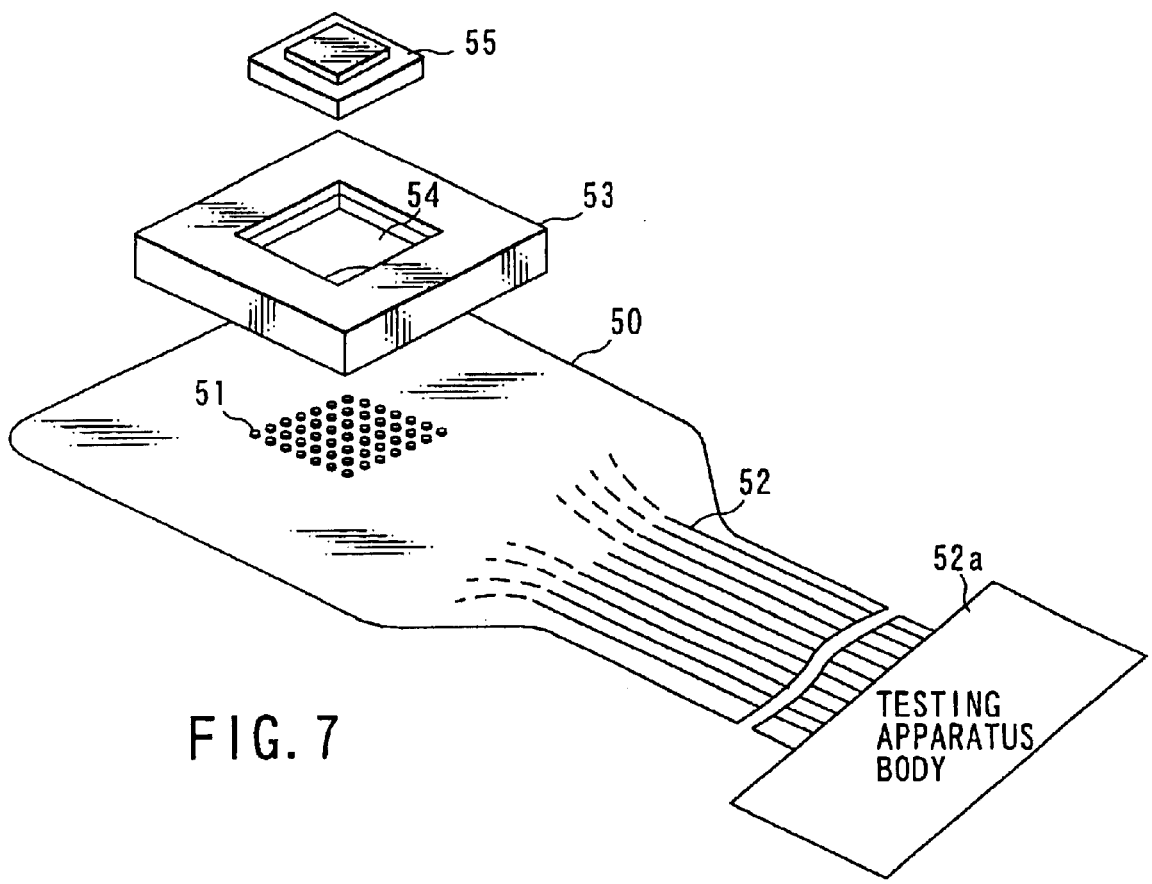
FIG. 7 is an exploded view of a testing apparatus that have projection electrodes according to the second embodiment of the invention.
Figure 8A:
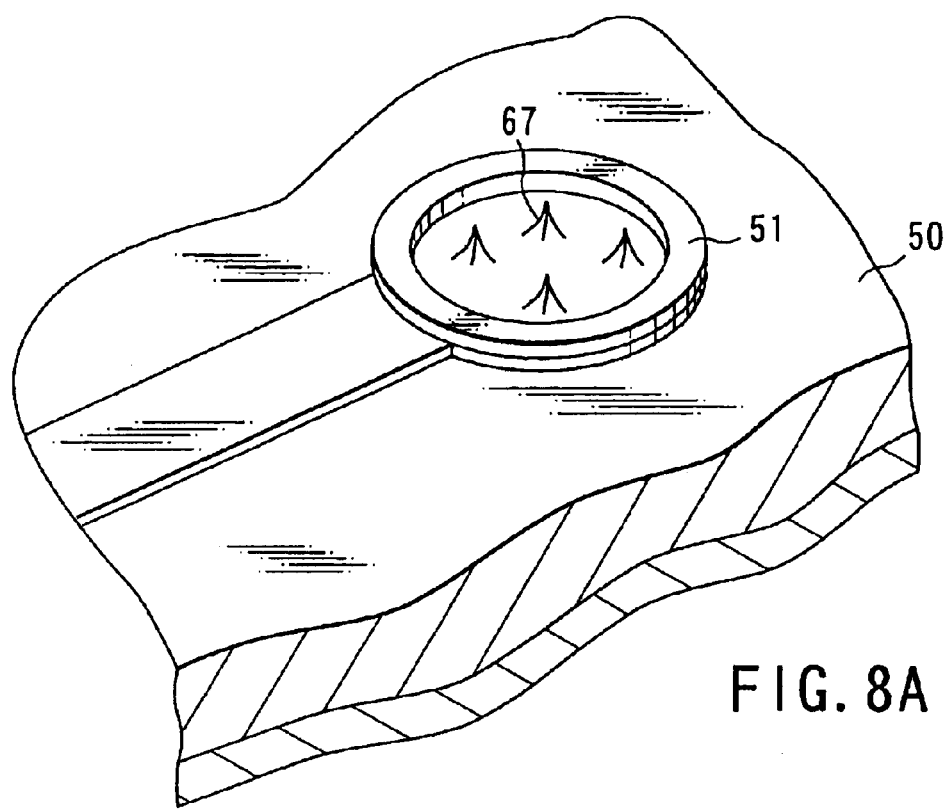
FIG. 8A is a magnified perspective view of a part of the testing apparatus, on which one projection electrode is provided.

FIG. 7 shows a part of a testing apparatus for testing electronic components. FIG. 8A is a magnified perspective view of a part of the testing apparatus, on which one projection electrode 51 according to the that the projecting electrodes 51 protrude upwards in the square opening. The square opening defines a chip-holding recess 54. In the recess 54, a chip-sized package (CSP) 55, for example, is placed with its electrodes extending downwards. Thus, the electrodes of the CSP 55 are directly connected to the bumps 67 of the projection electrodes 51.

Figure 8B:
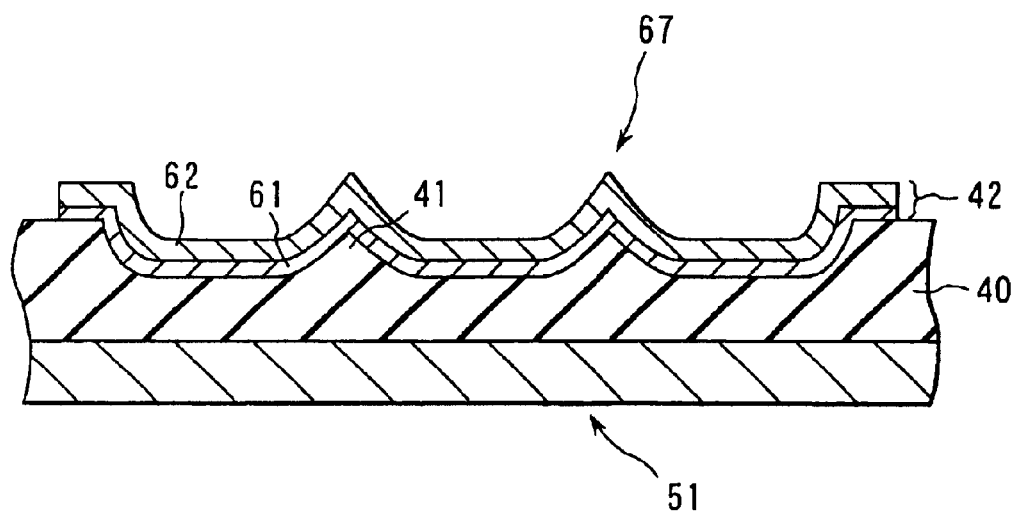
FIG. 8B is a magnified sectional view of the part of the testing apparatus.

As shown in FIG. 8B, the bumps 67 of each projection electrode 51 comprise projections 41 and a metal layer 42. The projections 41 are formed integral with the insulating layer 40 of the wiring board 50. The metal layer 42 covers the projections 41. The metal layer 42 is composed of two metal layers 61 and 62. The first metal layer 61 covers the insulating layer 40. The second metal layer 62 is provided on the first metal layer 61. When the CSP 55 is push into the chip-holding recess 54, the pointed peaks of the bumps 67 contact or bite into the electrodes of the CSP 55. As a result, the metal layer 42 of the projection electrode 51 is reliably set into electrical connection with one electrode of the CSP 55.

Since each projection electrode 51 has a plurality of bumps 67 as indicated above, no parts of any electrode of the SCP 55 will move to the corresponding projection electrode 51. Each projection electrode 51 can therefore be reliably connected to one electrode of the CSP 55, both electrically and mechanically. third embodiment is provided. FIG. 8B is a magnified sectional view of this part of the testing apparatus.

As FIG. 7 shows, the testing apparatus comprises a wiring board 50 and a testing apparatus body 52a. The wiring board 50 of the testing apparatus is, for example, a flexible printed circuit (FPC) board. Projection electrodes 51 are provided on one surface of the board 50. The projection electrodes 51 are electrically connected to the testing apparatus body 52a by wires 52 such as a lead patterns. As illustrated in FIGS. 8A and 8B, each projection electrode 51 has bumps 67. Each bump 67 has a cross section that is shaped like a mountain, as is shown in FIG. 8B and, hence, a pointed peak. To test an electronic component, the projection electrodes 51 are brought into contact with the electrodes of the electronic component. The outputs of the electronic component are supplied from the electrodes to the testing apparatus body 52a of the testing apparatus through the projection electrodes 51 and the wires 52. From the outputs of the component the testing apparatus body 52a determines whether the electronic component is correctly operating or not.

As FIG. 7 shows, the testing apparatus further comprises a receptacle 53. The receptacle 53 has a square opening in the center part. The receptacle 53 is provided on the wiring board 50 and so positioned FIGS. 9A to 9J are sectional views, and FIG. 10 is a flowchart. With reference to FIGS. 9A to 9J and FIG. 10, it will be described how the projection electrodes 51 are formed on the wiring board 50 of testing apparatus.

Figure 9A:
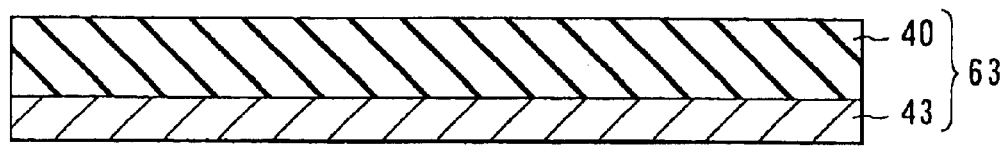
FIGS. 9A to 9J are sectional views, explaining a method of forming projection electrodes on the wiring board of testing apparatus.
Figure 10:
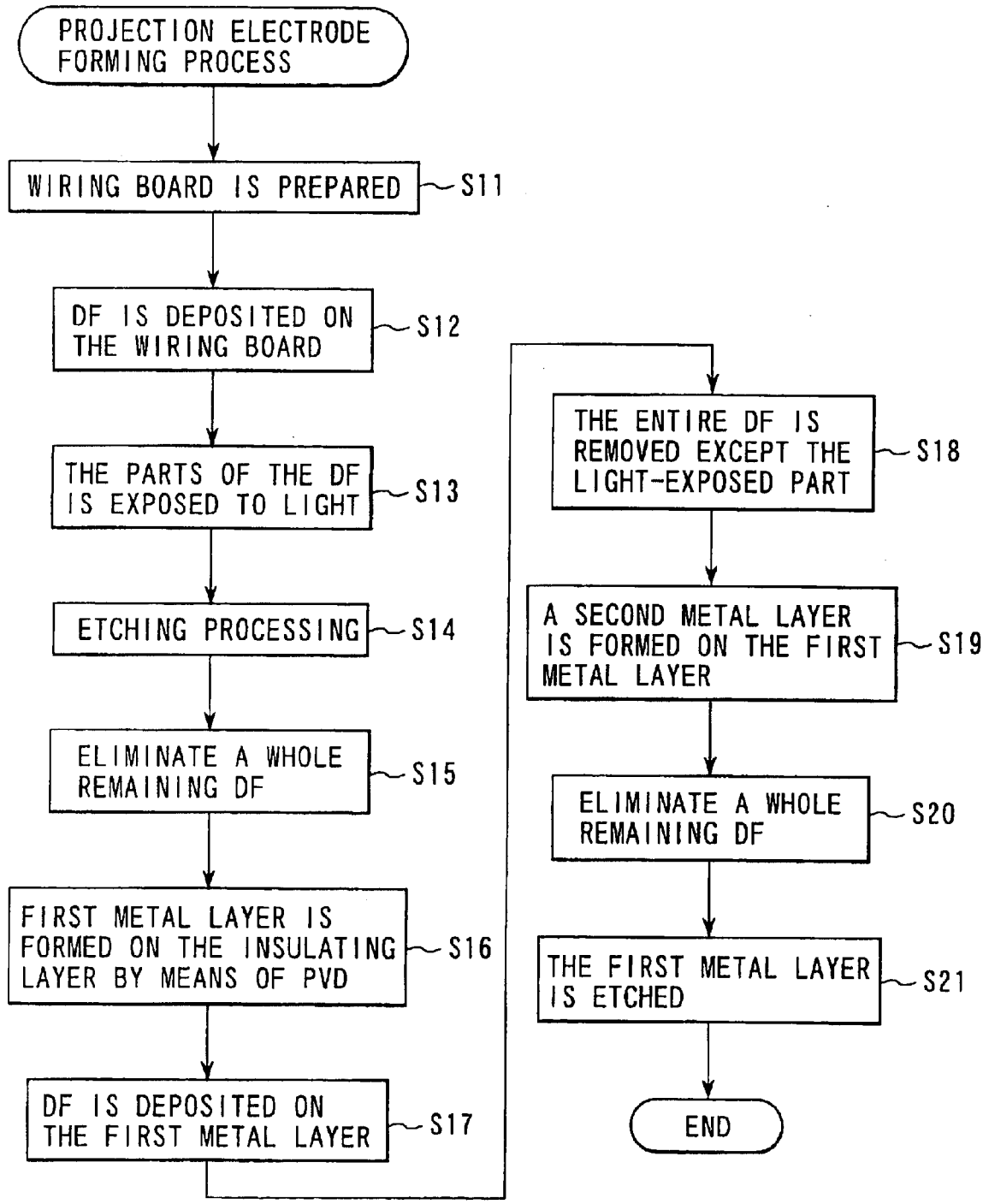
FIG. 10 is a flowchart explaining how the projection electrodes are formed on the wiring board.

First, a wiring board 63 of the type shown in FIG. 9A is prepared (Step S11). The board 63 comprises an insulating layer 40 and a metal layer 43. The metal layer 43 supports and reinforces the insulating layer 40. The board 63 may comprise the insulating layer 40 only.

Figure 9B:
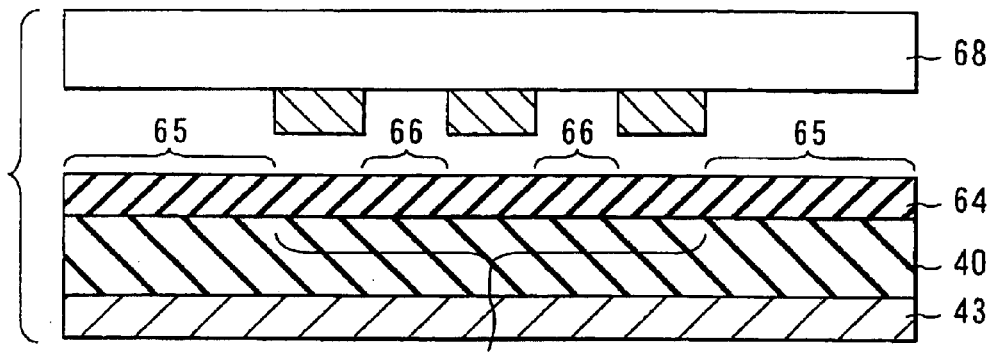

As shown in FIG. 9B, a dry film resist (DF) 64 is deposited on the insulating layer 40 of the wiring board 63 (Step S12). The DF 64 is, for example, a photosensitive film. A mask 68 is then laid on the DF 64, covering only the parts other than the parts 65 and 66. The parts 65 will be processed into circuit patterns. The parts 66 will be processed, forming a projecting electrode 51 in a region 70 (hereinafter referred to as "projection electrode region").

Figure 9C:
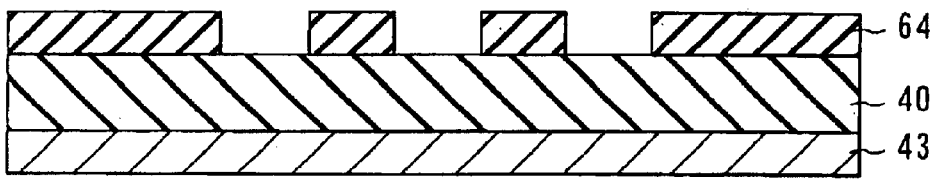

Then, light is applied via the mask 68 to the DF 64, thus exposing some parts of the DF 64 to light. The mask 68 is removed from the DF 64. The parts of the DF 64, exposed to light, are developed and removed as shown in FIG. 9C (Step S13). FIG. 11 is a plan view showing the wiring board 63 and the DF 64 that no longer has the light-exposed parts. openings 31 shown in FIG. 11 have been made by removing the light-exposed parts of the DF 64.

Figure 9D:
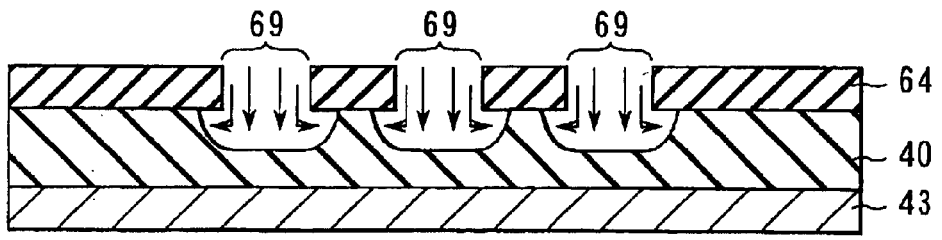

As shown in FIG. 9D, which is a sectional view taken along line I-I in FIG. 11, the insulating layer 40 is subjected to, for example, isotropic etching, thus removing surface regions of the layer 40 which are exposed through the openings 31 (FIG. 11) of the DF 64 (Step S14). Projections 41 are thereby formed of the insulating layer 40. The isotropic etching is continued, sharpening the projections 41.

Thereafter, the resultant structure is immersed in a DF-removing solution such as a halogen-based organic solvent, thus subjected to wet etching (Step S15). The DF 64 is thereby removed in its entirety.

Figure 9E:
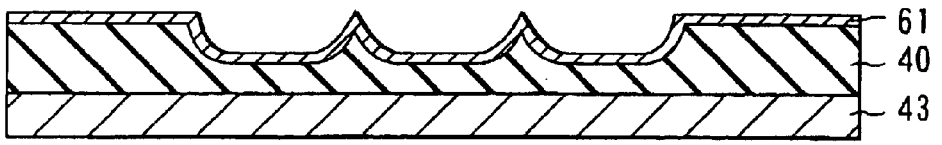

As shown in FIG. 9E, a first metal layer 61 is formed on the insulating layer 40 by means of physical vapor deposition (PVD) (Step S16). The first metal layer 61 is a thin layer of chromium (Cr), nickel (Ni), copper (Cu), silver (Ag), gold (Au), platinum (Pt), rhodium (Rh), palladium (Pd), or the like. The PVD may be vacuum vapor deposition or sputtering, which can form a thin film of Cu or the like on the insulating layer 40.

Figure 9F:
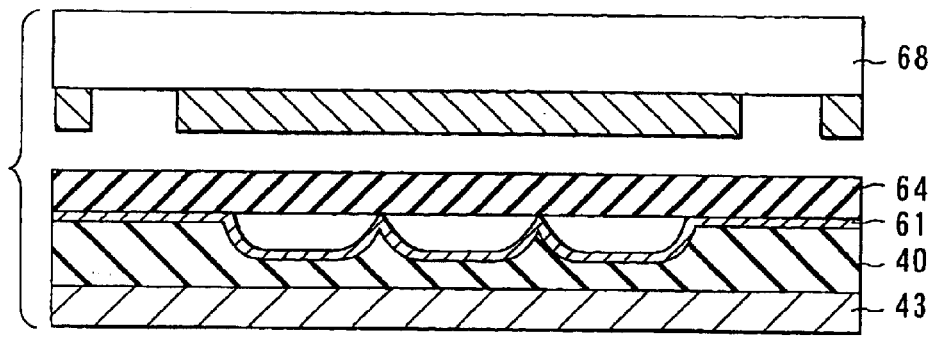

As illustrated in FIG. 9F, a DF 64 is deposited on the first metal layer 61 (Step S17). Further, a mask 68 is laid on the DF 64, covering DF 64, except the part which lies on the part 71 (FIG. 9G) of the layer 61. The part of the DF 64 is exposed to light through the mask 68.

Figure 9G:
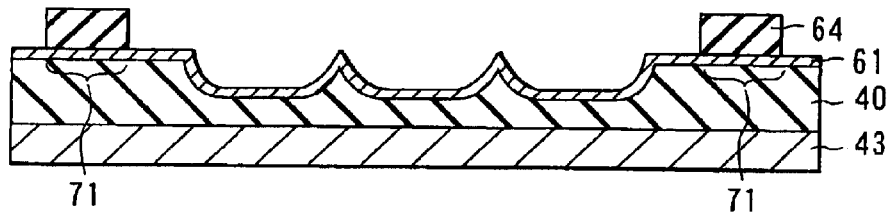

As shown in FIG. 9G, the mask 68 is removed, and the light-exposed part of the DF 64 is developed. The entire DF 64 is removed, except the light-exposed part (Step S18).

Figure 9H:
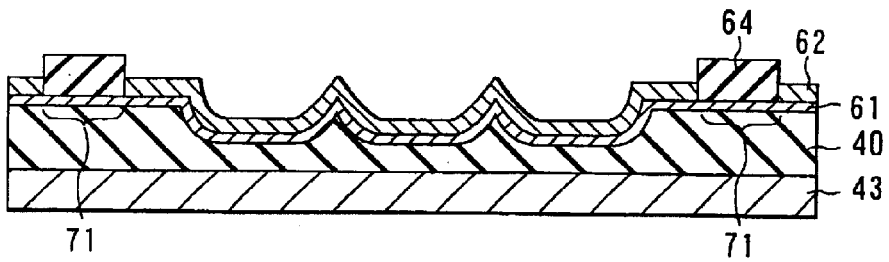

Then, as shown in FIG. 9H, a second metal layer 62 is formed by, for example, plating, on the first metal layer 61, but not on the light-exposed part of the DF 64 (Step S19). The second metal layer 62 is made of Cr, Ni, Cu, Ag, Au, Pt, Rh, Pd or the like. The layer 62 must be made of metal that can serve an etching resist in any etching process that will be carried out later. The second metal layer 62 may be replaced by one composed of two or more layers of the same metal or different metals, which is therefore stronger than the metal layer 62. In this case, the uppermost layer must be made of metal that can serve an etching resist in any etching process that will be carried out later. The first metal layer 61, on which the second metal layer 62 has been formed, will be etched later into a desired circuit pattern that is provided on the wiring board 63.

Figure 9I:
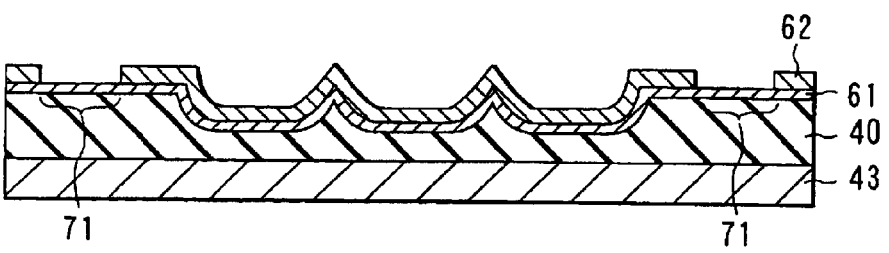

After the second metal layer 62 has been formed by plating on the first metal layer 61, the above-mentioned DF-removing solution is applied to the resultant structure. The DF 64 is thereby removed from the part 71 of the first metal layer 61 as is illustrated in FIG. 9I (Step S20).

Figure 9J:
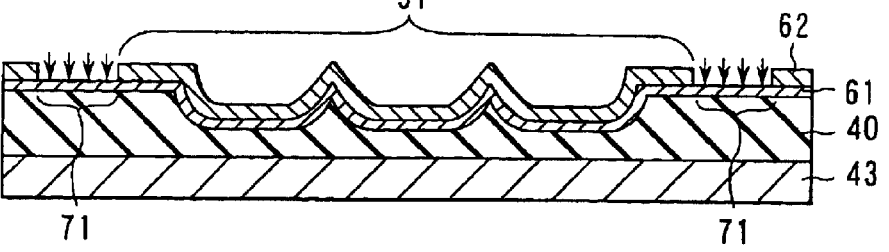

Finally, as shown in FIG. 9J, that part of the first metal layer 61 from which the DF 64 has been removed is etched in the same way as described above (Step S21). As a result, a circuit pattern is formed on the wiring board 63, and the projection electrode 51 is obtained.

In the method of forming the projection electrode 51, the DF 64 is a so-called "negative resist." Nonetheless, the DF 64 may be a so-called "positive resist." If the DF 64 is a positive resist, the DF mask portion 30 will be exposed to light, while those parts of the insulating layer 40 which are exposed though the openings 31 of the DF 64 will not be exposed to light. Thus it is possible to form a projection electrode 51 on the wring board 63 by etching in the same way as in the case DF 64 is a negative resist.

Projection electrodes 51 can be formed in a desired form by changing various process conditions, such as the thickness and material for the metal layers 61 and 62, wiring board 63 (i.e., a combination of mask portion 30 and metal layer 43) and DF 64 and the composition and temperature of the etching solution. The electrodes 51 can be formed in a fine and minute circuit, unlike in the case where they are formed, along with wires 52, by processing a laminate of conductive layers (e.g., copper layers), each being relatively thick. This is because the thickness of the substrate is not limited as in the case where projection electrodes are formed by processing such a laminate. In addition, the projection electrodes 51 can be easily formed even on a wiring board with no circuit layer formed on it, because the metal layer 42 is formed on the projections 41 after the projections 41 have been formed directly on the insulating layer 40. Furthermore, the projection electrodes 51 can have the same shape, because the above-mentioned process conditions are changed, thereby controlling the direction in which the insulating layer 40 and first metal layer 61 are etched.

The projections 41 may be formed as will be described below, not by performing Steps S12 to S14 described above.

As shown in FIG. 12A, a laser beam whose intensity of which has been adjusted is applied from the distal end 80 of laser (not shown) to the insulating layer 40 of the wiring board 63 prepared in Step S11. Grooves 81 are thereby made in the surface of the insulating layer 40. Having high directivity as any laser beam, the laser beam can be applied to any desired position on the layer 40, whereby a groove can be made at any desired position on the layer 40. Further, since the laser beam is most intense at its axis and least intense at its periphery, as illustrated in FIG. 12B, it can make a U- or V-groove 81 in the surface of the layer 40 when it is applied to the layer 40. As a result, projections 41 formed, each located between two adjacent grooves 81, have a cross section shaped like a mounting with a pointed peak.

Figure 13A:
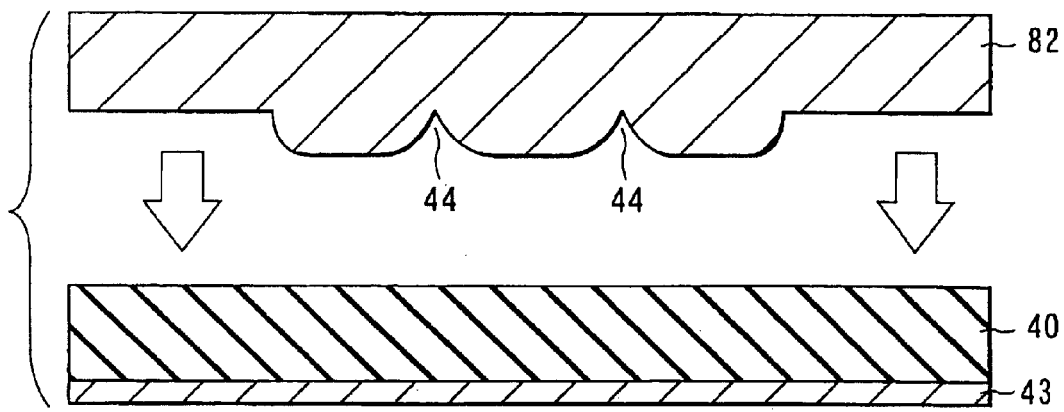
FIGS. 13A to 13C are sectional views, explaining another method of forming a mountain-shaped bump on the wiring board.
Figure 13B:
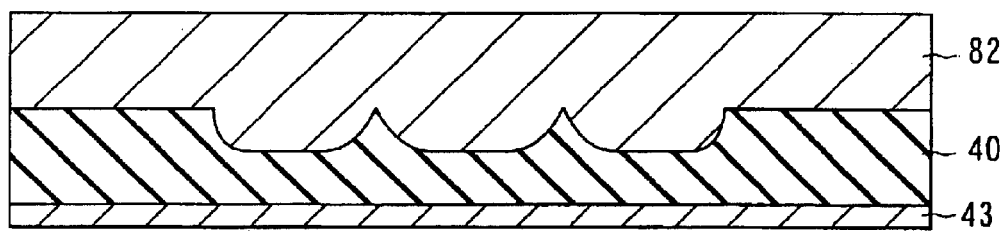
Figure 13C:
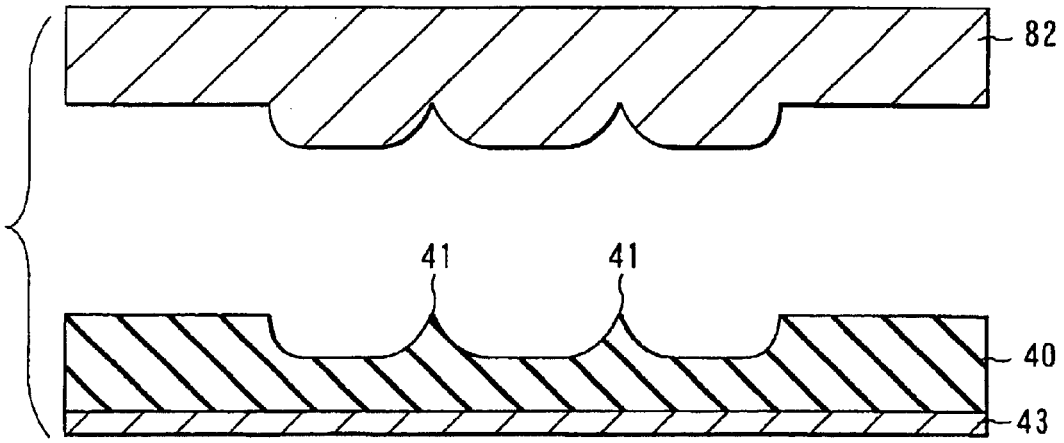

Alternatively, the projections 41 may be formed by the use of a stamper 82, as is illustrated in FIGS. 13A to 13C. As shown in FIGS. 13A to 13C, the stamper 82 has grooves 44 identical in shape to the projections 41. First, the stamper 82 is placed above the insulating layer 40 of the wiring board 63 as is illustrated in FIG. 13A. Then, as shown in FIG. 13B, the stamper 82 is pressed onto the insulating layer 40 that has yet to be hardened completely. The stamper 82 is moved away from the layer 40, forming projections 41 as is shown in FIG. 13C. Thereafter, Step S16 to S21 (FIG. 10), whereby the projection electrodes 51 are formed.

Figure 14:
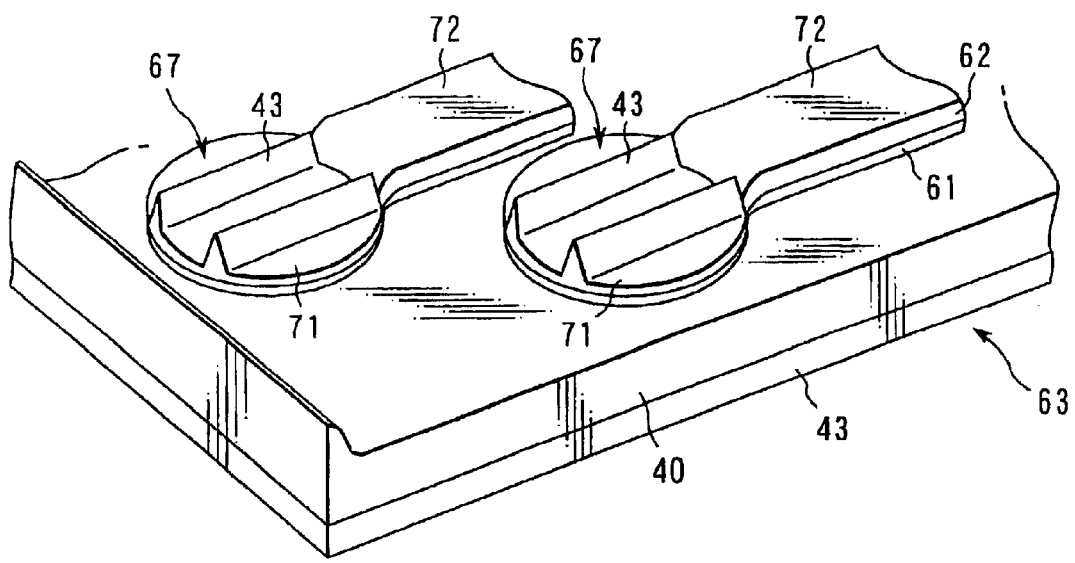
FIG. 14 is a perspective view of a wiring board and projection electrodes formed on the wiring board and each having a bump which differs in shape from those shown in FIGS. 8A and 8B.
Figure 15:
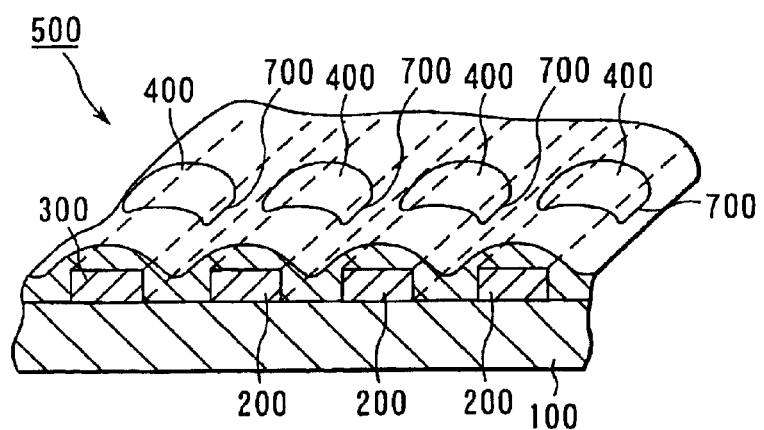
FIG. 15 is a view showing projection electrodes on a conventional wiring board.

FIG. 14 is a perspective view of a wiring board 63 according to the second embodiment of the invention. Projection electrodes 71 are formed on the board 63. Each electrode 71 has a bump that differs in shape from those shown in FIGS. 8A and 8B. The projection electrodes 71 have been formed as described below.

First, an insulating layer 40 that has yet to be hardened completely is formed on the wiring board 63. A stamper (not shown) having grooves is pressed onto the insulating layer 40 and then is moved away from the layer 40. Projections 41 having a mountain-shaped cross section are thereby formed integral with the layer 40. Two metal layers 61 and 62 are formed on the insulating layer 40 in the order they are mentioned. Projection electrodes 71 are thereby formed. Each projection electrode has a bump made of the metal layer 43 and formed on the projection 41.

Although, in the present invention, the testing apparatus for testing an electronic component having a testing board with projection electrodes formed thereon has been explained by taking the CSP, for example, as an electronic component, it is needless to say that, in order to test a bare chip for example, a testing board with such projection electrodes formed thereon can also be used for electronic component testing. Even in this case, it is possible to maintain a better electrical connection. Further, if the socket size of the electronic component testing apparatus is varied for example, the testing of various electronic components can be made with the use of such projection electrodes and can be done so for any CSP or bare chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention as defined by the appended claims and their equivalents.

What is claimed is:

1. A method for forming a projection electrode, comprising:
    forming an electrode pattern on a wiring board;
    forming a mask pattern on the electrode pattern for masking a portion of the electrode pattern, wherein the mask pattern comprises a single continuous structure with one or more portions removed to permit etching of exposed portions of the electrode pattern located directly below the removed portions of the mask pattern;
    wet etching the exposed portions of the electrode pattern to form a tapered bump with a sharp pointed end; and
    eliminating the mask pattern.

2. The method according to claim 1, further comprising forming a plated layer on the mask pattern-eliminated electrode pattern.

3. The method according to claim 1, wherein said forming a tapering bump comprises isotropically wet etching utilizing a corrosion action of an etching solution from around the mask pattern.

4. The method according to claim 1, further comprising forming a plated layer on the mask pattern-eliminated electrode pattern.

5. A method for forming a projection electrode, comprising:
    forming an electrode pattern on an electronic device;
    forming a dry-film resist on the electrode pattern for masking a portion of the electrode pattern, wherein the dry-film resist comprises a single continuous structure with one or more portions removed to permit etching of exposed portions of the electrode pattern located directly below the removed portions of the dry-film resist;
    etching the exposed portions of the electrode pattern to form sharp pointed bump portions on the electrode pattern; and
    eliminating the mask pattern.

6. The method as claimed in claim 5, wherein said etching comprises isotropically wet-etching the unmasked portions of the electrode pattern.

7. The method as claimed in claim 5, further comprising plating the etched portions of the electrode pattern.

8. The method as claimed in claim 7, wherein said plating comprises forming a layer of material the etched portions of the electrode pattern, the material comprising at least one material selected from the group of rhodium, palladium and gold.

9. A method for forming a projection electrode, comprising:
    forming an electrode pattern on an electronic device;
    forming a dry-film resist on the electrode pattern for masking a portion of the electrode pattern, wherein the dry-film resist comprises a single continuous structure with one or more portions removed to permit etching of exposed portions of the electrode pattern located directly below the removed portions of the dry-film resist;
    etching the exposed portions of the electrode pattern to form sharp pointed blade-shaped bump portions on the electrode pattern;
    eliminating the mask pattern.

10. A method as claimed in claim 9, wherein the blade-shaped portions are parallel.

11. A method for forming a projection electrode, comprising:
    forming an electrode pattern on an electronic device;
    forming a dry-film resist on the electrode pattern for masking a portion of the electrode pattern, wherein the dry-film resist comprises a single continuous structure with one or more portions removed to permit etching of exposed portions of the electrode pattern located directly below the removed portions of the dry-film resist;
    etching the exposed portions of the electrode pattern to form pointed bump portions on the electrode pattern, wherein each pointed bump portion has a star-shaped cross section; and
    eliminating the mask pattern.

12. A method for forming a projection electrode, the method comprising:
    forming an electrode pattern on an electronic device;
    forming a resist pattern on the electrode pattern, wherein the resist pattern comprises a single continuous structure with one or more portions removed to permit etching of exposed portions of the electrode pattern located directly below the removed portions of the resist pattern;
    etching the exposed portions of the electrode pattern through the resist pattern to form at least one sharp pointed bump portion on the electrode pattern, wherein the at least one pointed bump portion has a star-shaped cross section.

13. A method as set forth in claim 12, wherein during said etching, the resist pattern remains in constant contact with a peripheral portion of the electrode pattern.

14. A method as set forth in claim 12, wherein during said etching, the resist pattern comprises a plurality of circular portions equally spaced from one another.

15. A method as set forth in claim 14, wherein as a result of said etching, the sharp pointed bump portions have a star-shaped cross section.

* * * * *

UNITED STATES PATENT AND TRADEMARK OFFICE
CERTIFICATE OF CORRECTION

PATENT NO. : 6,892,452 B2
APPLICATION NO. : 09/842047
DATED : May 17, 2005
INVENTOR(S) : Yasuo Fukuda et al.

It is certified that error appears in the above-identified patent and that said Letters Patent is hereby corrected as shown below:

On the face of the patent:
Please add the following Assignee omitted from the Assignee data:
On the Title Page, Item (73) Assignee should read
--(73) Assignee: Fujikura Ltd., Tokyo (JP)--.

Signed and Sealed this

Ninth Day of January, 2007

JON W. DUDAS
*Director of the United States Patent and Trademark Office*